United States Patent
Kim et al.

(10) Patent No.: US 8,278,992 B2
(45) Date of Patent: Oct. 2, 2012

(54) CIRCUIT AND METHOD FOR GENERATING INTERNAL VOLTAGE, AND SEMICONDUCTOR DEVICE HAVING THE CIRCUIT

(75) Inventors: So-Young Kim, Cheongju-si (KR); Jung Sik Kim, Seoul (KR); Jang-Woo Ryu, Seoul (KR); Ho Cheol Lee, Yongin-si (KR); Jung Bae Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 142 days.

(21) Appl. No.: 12/845,279

(22) Filed: Jul. 28, 2010

(65) Prior Publication Data

US 2011/0095814 A1    Apr. 28, 2011

(30) Foreign Application Priority Data

Oct. 26, 2009   (KR) .................. 10-2009-0101713

(51) Int. Cl.
 *G05F 1/10* (2006.01)
(52) U.S. Cl. ................ 327/538; 327/143; 327/540
(58) Field of Classification Search .............. 327/538, 327/143, 198, 540
See application file for complete search history.

(56) References Cited

U.S. PATENT DOCUMENTS

| | | | | |
|---|---|---|---|---|
| 5,682,111 A * | 10/1997 | Bacrania et al. | ............. | 327/143 |
| 6,078,201 A * | 6/2000 | Crotty | ............. | 327/143 |
| 6,097,659 A * | 8/2000 | Kang | ............. | 365/226 |
| 6,333,650 B1 * | 12/2001 | Amin et al. | ............. | 327/143 |
| 6,646,844 B1 * | 11/2003 | Matthews | ............. | 361/78 |
| 6,768,222 B1 * | 7/2004 | Ricks | ............. | 307/32 |
| 6,768,354 B2 * | 7/2004 | Yamazaki et al. | ............. | 327/143 |
| 6,914,462 B2 * | 7/2005 | Kim et al. | ............. | 327/143 |
| 6,944,812 B2 * | 9/2005 | Chevallier | ............. | 714/745 |
| 7,030,681 B2 * | 4/2006 | Yamazaki et al. | ............. | 327/534 |
| 7,049,865 B2 * | 5/2006 | Parker et al. | ............. | 327/143 |
| 7,208,923 B2 * | 4/2007 | Horimoto | ............. | 323/269 |
| 7,271,504 B2 * | 9/2007 | Wada | ............. | 307/85 |
| 7,295,051 B2 * | 11/2007 | Li et al. | ............. | 327/143 |
| 7,307,822 B2 | 12/2007 | Kitagawa et al. | | |
| 7,313,048 B2 * | 12/2007 | Ishikawa et al. | ............. | 365/226 |
| 7,372,758 B2 * | 5/2008 | Yaoi et al. | ............. | 365/226 |
| 7,679,412 B2 * | 3/2010 | Ogiwara et al. | ............. | 327/143 |
| 7,770,037 B2 * | 8/2010 | Searles et al. | ............. | 713/300 |
| 7,855,930 B2 * | 12/2010 | Chen | ............. | 365/226 |
| 7,965,573 B2 * | 6/2011 | Byeon | ............. | 365/226 |
| 2002/0140468 A1 * | 10/2002 | Kato et al. | ............. | 327/143 |
| 2005/0135033 A1 | 6/2005 | Kitagawa et al. | | |
| 2006/0103437 A1 * | 5/2006 | Kang | ............. | 327/143 |
| 2007/0210774 A1 * | 9/2007 | Kimura et al. | ............. | 323/282 |
| 2010/0194453 A1 * | 8/2010 | Kadowaki | ............. | 327/143 |
| 2011/0148482 A1 * | 6/2011 | Gussoni et al. | ............. | 327/143 |

FOREIGN PATENT DOCUMENTS

| | | |
|---|---|---|
| JP | 2002-10488 | 1/2002 |
| JP | 2005-184623 | 7/2005 |
| KR | 10-2007-0076081 | 7/2007 |

\* cited by examiner

*Primary Examiner* — Thomas J Hiltunen
(74) *Attorney, Agent, or Firm* — Onello & Mello, LLP

(57) ABSTRACT

An internal voltage generating method performed in a semiconductor device, the internal voltage generating method including generating a plurality of initialization signals corresponding to a plurality of external power supply voltages; detecting a transition of a lastly-generated initialization signal from among the plurality of initialization signals and generating a detection signal; and generating a first internal voltage according to the detection signal.

12 Claims, 11 Drawing Sheets

US 8,278,992 B2

CIRCUIT AND METHOD FOR GENERATING INTERNAL VOLTAGE, AND SEMICONDUCTOR DEVICE HAVING THE CIRCUIT

CROSS-REFERENCE TO RELATED APPLICATIONS

This application claims the benefit of Korean Patent Application No. 10-2009-0101713, filed on Oct. 26, 2009, in the Korean Intellectual Property Office, the contents of which are incorporated herein in their entirety by reference.

BACKGROUND

An embodiment of the inventive concept relates to semiconductor power supply management, and more particularly, to an internal voltage generation circuit and method for reducing a surge current caused by power-up, and a semiconductor device including the internal voltage generation circuit.

Semiconductor devices generally use a low internal voltage to which a high externally supplied voltage is converted. There is a recent trend toward a decrease in an operating voltage. In particular, mobile products tend to use lower operating voltages.

"Power-up" refers to the supply of a power supply voltage in order to operate semiconductor devices. During this power-up operation, a semiconductor device does not immediately operate with an external power supply voltage at the instant when the external power supply voltage is supplied, but a stabilization time is required for the semiconductor device to operate after the external power supply voltage is increased to a certain level or greater.

Accordingly, a semiconductor device uses a stabilization circuit for preventing unstable operation, a latch-up phenomenon, or the like of an internal circuit during power-up. In addition, the semiconductor device uses an initialization signal generation circuit for initializing the components of the semiconductor device until a power supply voltage is stabilized, and for concluding the initialization and allowing the components to perform normal operations when the power supply voltage is stabilized. An initialization signal generated by the initialization signal generation circuit is also referred to as a power-up reset signal, and the initialization signal generation circuit is also referred to as a power-up reset circuit.

SUMMARY

The present inventive concept provides an internal voltage generation circuit and method by which internal voltages are generated in a certain sequence regardless of the order in which a plurality of external power supply voltages are generated, in order to prevent an unstable operation or a latch-up phenomenon of an internal circuit from occurring due to a variation in the sequence in which internal voltages are generated during power-up, and by which overshoot of the internal voltages is prevented and a surge current is dispersed. The present inventive concept is also directed to a semiconductor device including the internal voltage generation circuit.

According to an aspect of the present inventive concept, there is provided an internal voltage generating method performed in a semiconductor device, the internal voltage generating method including: generating a plurality of initialization signals corresponding to a plurality of external power supply voltages; detecting a transition of a lastly-generated initialization signal from among the plurality of initialization signals and generating a detection signal; and generating a first internal voltage according to the detection signal.

The internal voltage generating method further includes generating a delay detection signal by delaying the detection signal for a predetermined period of time, wherein the first internal voltage is generated in response to the delay detection signal.

The internal voltage generating method further includes generating at least one second internal voltage in response to the detection signal and the first internal voltage.

The plurality of external power supply voltages are supplied at different points in time and with different levels.

The generating of the first internal voltage is generating the first internal voltage by using one of the plurality of external power supply voltages in response to the detection signal.

The internal voltage generating method further includes generating an internal initialization signal in response to the first internal voltage; and generating a second internal voltage in response to the internal initialization signal and one of the plurality of external power supply voltages.

According to another aspect of the present inventive concept, there is provided an internal voltage generation circuit of a semiconductor device, the internal voltage generation circuit including an initialization signal generation block for generating a plurality of initialization signals in response to a plurality of external power supply voltages, respectively, detecting a transition of a lastly-generated initialization signal from among the plurality of initialization signals, and generating a detection signal; and an internal voltage generation block for generating a first internal voltage in response to the detection signal.

The initialization signal generation block includes a delay circuit for delaying the detection signal for a predetermined period of time so as to generate a delay detection signal; and the internal voltage generation block generates the first internal voltage in response to the delay detection signal.

According to another aspect of the present inventive concept, there is provided a semiconductor device including an internal circuit for using a first internal voltage as an operating voltage; an initialization signal generation block for generating a plurality of initialization signals in response to a plurality of external power supply voltages, respectively, detecting a transition of a lastly-generated initialization signal from among the plurality of initialization signals, and generating a detection signal; and an internal voltage generation block for generating the first internal voltage in response to the detection signal.

BRIEF DESCRIPTION OF THE DRAWINGS

The above and other features and advantages of the present invention will become more apparent by describing in detail preferred embodiments with reference to the attached drawings, in which.

DETAILED DESCRIPTION OF THE EMBODIMENTS

Hereinafter, aspects of the present inventive concept will be described by explaining illustrative embodiments in accordance therewith, with reference to the attached drawings. While describing these embodiments, detailed descriptions of well-known items, functions, or configurations are typically omitted for conciseness.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 1:
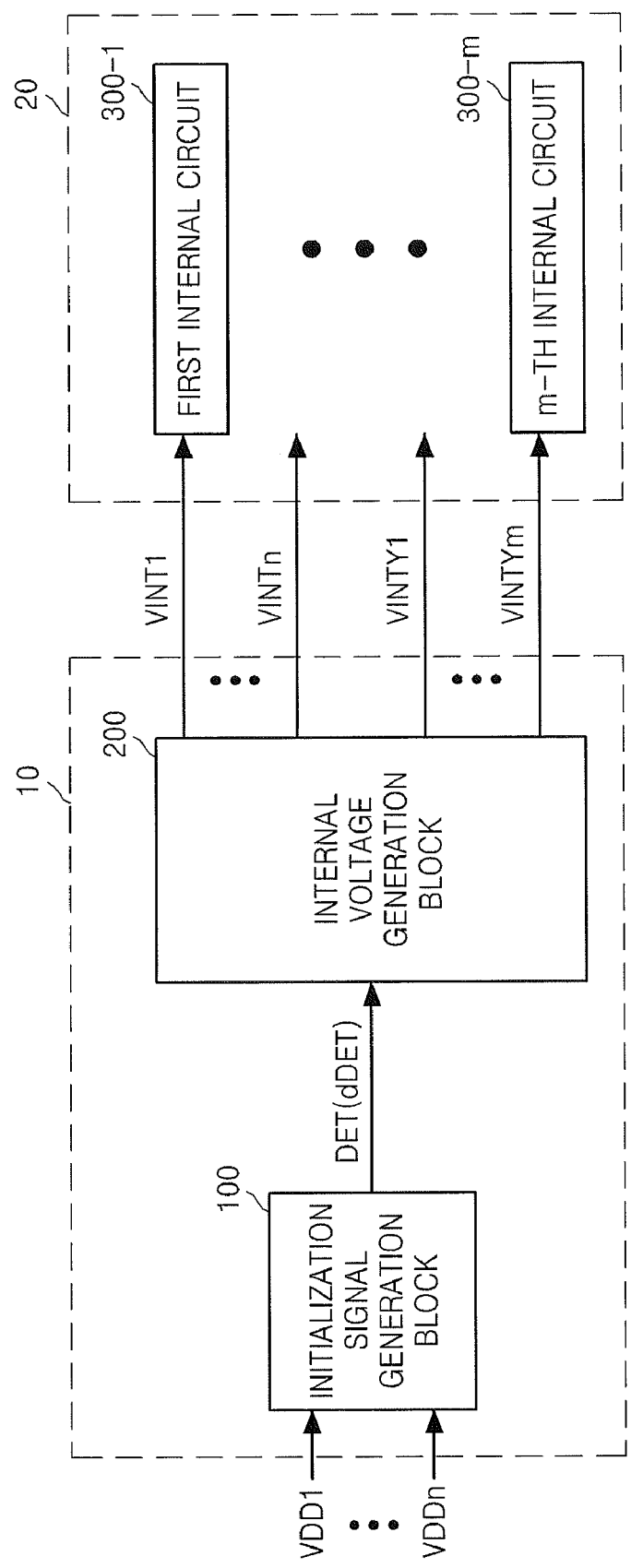
FIG. 1 is a schematic block diagram of a semiconductor device including an internal voltage generation circuit according to an embodiment of the present invention.

FIG. 1 is a schematic block diagram of a semiconductor device including an internal voltage generation circuit according to an embodiment of the present inventive concept. Referring to FIG. 1, the semiconductor device, which uses multi-power voltages, includes the internal voltage generation circuit 10 and an internal circuit block 20.

The internal voltage generation circuit 10 includes an initialization signal generation block 100 and an internal voltage generation block 200. The initialization signal generation block 100 generates a plurality of initialization signals (or a plurality of power-up reset signals) in response to a plurality of external power supply voltages VDD1 through VDDn, respectively, and detects a level transition of the lastly generated initialization signal from among the plurality of initialization signals to generate a detection signal DET or a delay detection signal dDET.

That is, the initialization signal generation block 100 generates a detection signal DET or a delay detection signal dDET capable of powering up at least one internal voltage, namely, first internal voltages VINT1 through VINTn and second internal voltages VINTY1 through VINTYm, after all of the external power supply voltages VDD1 through VDDn supplied to the internal voltage generation circuit 10 are powered up. Points in time and voltage levels when the external power supply voltages VDD1 through VDDn are supplied to the initialization signal generation block 100 may be different from one another.

The internal voltage generation block 200 generates the plurality of first and second internal voltages VINT1 through VINTn and VINTY1 through VINTYm in response to the detection signal DET or the delay detection signal dDET. Here, n and m denote natural numbers, and n=m or n≠m. The first and second internal voltages VINT1 through VINTn and VINTY1 through VINTYm may have different voltage levels.

The internal circuit block 20 includes a plurality of internal circuits, namely, first through m-th internal circuits 300-1 through 300-$m$. The first through m-th internal circuits 300-1 through 300-$m$ may be logic circuits or data processing circuits that use the first and second internal voltages VINT1 through VINTn and VINTY1 through VINTYm as operating voltages. For example, the first internal circuit 300-1 may use the internal voltage VINT1 as an operating voltage, and the m-th internal circuit 300-$m$ may use the internal voltage VINTYm as an operating voltage.

Figure 2:
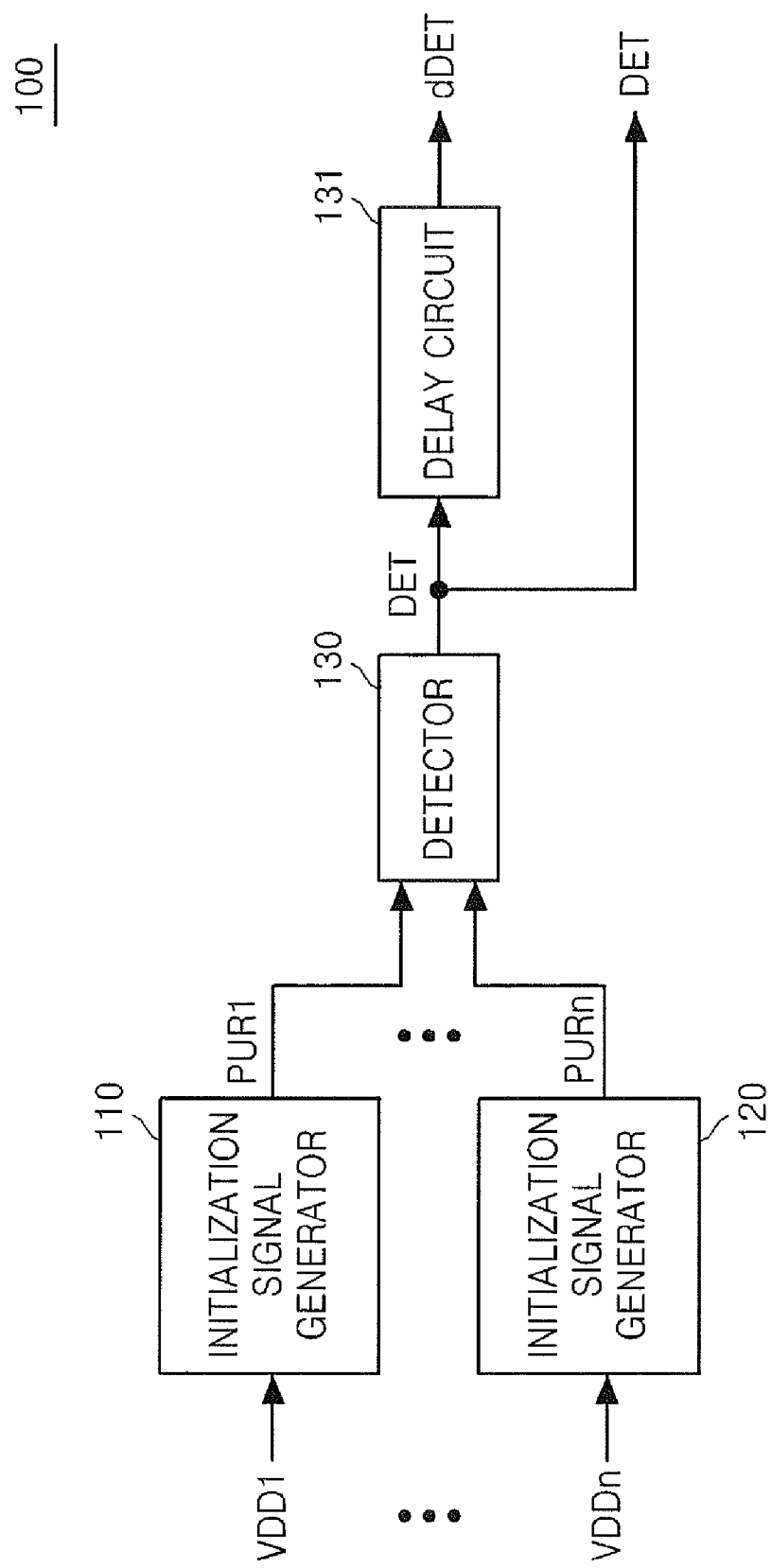
FIG. 2 is a block diagram of an initialization signal generation block illustrated in FIG. 1.

FIG. 2 is a block diagram of an initialization signal generation block illustrated in FIG. 1. Referring to FIG. 2, the initialization signal generation block 100 includes a plurality of initialization signal generators (or a plurality of power-up reset circuits 110, . . . , 120) and a detector 130.

The initialization signal generation block 100 may further include a delay circuit 131 for delaying the detection signal DET for a predetermined period of time to generate the delay detection signal dDET.

The initialization signal generators 110, . . . , 120 may generate a plurality of initialization signals PUR1, . . . , PURn in response to the external power supply voltages VDD1, . . . , VDDn, respectively. The initialization signals PUR1, . . . , PURn may be generated at different points in time according to the points in time and voltage levels when the external power supply voltages VDD1, ..., VDDn are supplied to the initialization signal generators 110, ..., 120.

The detector 130 may receive the initialization signals PUR1, ..., PURn generated at different points and detect a level transition of the lastly generated initialization signal from among the initialization signals PUR1, ..., PURn, thereby outputting the detection signal DET.

Figure 3:
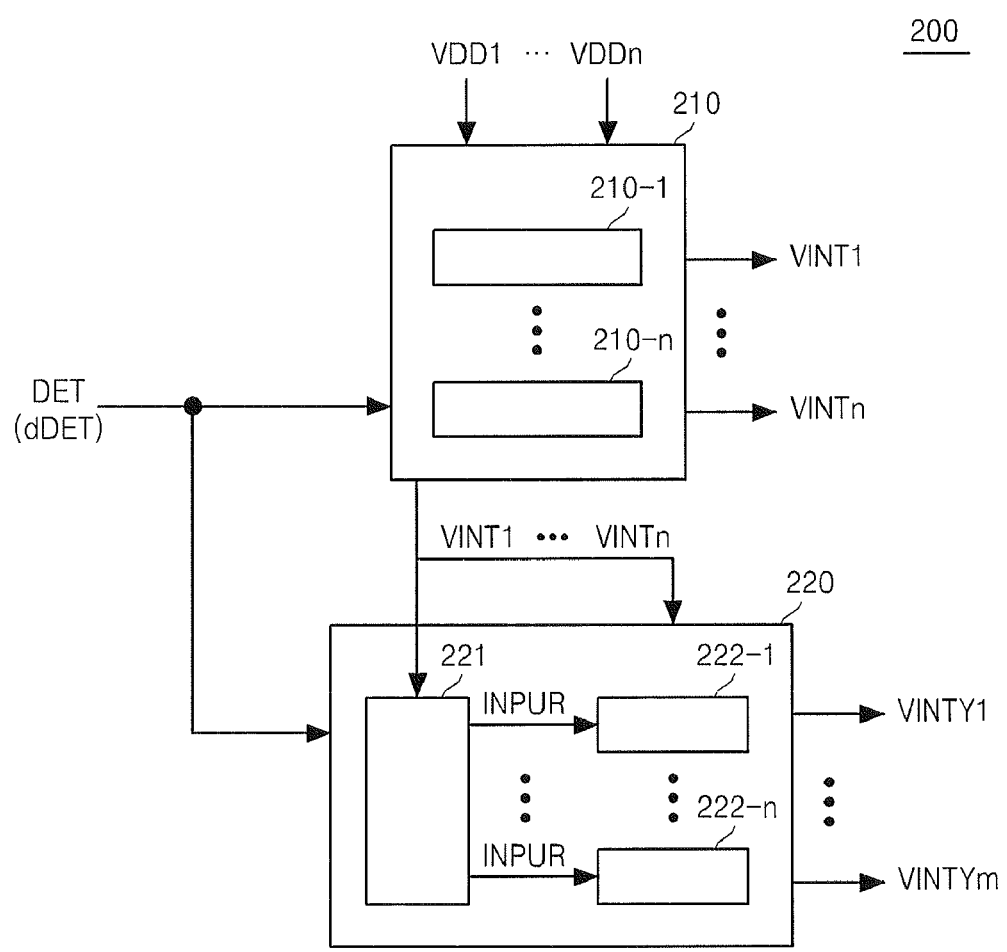
FIG. 3 is a detailed block diagram of an internal voltage generation block illustrated in FIG. 1.

FIG. 3 is a detailed block diagram of the internal voltage generation block 200 illustrated in FIG. 1. Referring to FIG. 3, the internal voltage generation block 200 includes a first internal voltage generation block 210 and a second internal voltage generation block 220.

The first internal voltage generation block 210 may receive the external power supply voltages VDD1 through VDDn and generate the first internal voltages VINT1 through VINTn corresponding to the external power supply voltages VDD1 through VDDn, respectively, in response to the detection signal DET or the delay detection signal dDET. The voltage levels of the first internal voltages VINT1 through VINTn may be different from one another. For example, the internal voltage VINT1 may be generated using the external power supply voltage VDD1, and the internal voltage VINTn may be generated using the external power supply voltage VDDn.

The second internal voltage generation block 220 may receive the first internal voltages VINT1 through VINTn and generate the second internal voltages VINTY1 through VINTYm in response to one of the detection signal DET and the delay detection signal dDET and at least one of the first internal voltages VINT1 through VINTn. The second internal voltages VINTY1 through VINTYm may have different voltage levels.

The first internal voltage generation block 210 may include a plurality of first internal voltage generators 210-1 through 210-n. The first internal voltage generators 210-1 through 210-n may generate the first internal voltages VINT1 through VINTn, respectively, by using the external power supply voltages VDD1 through VDDn in response to the detection signal DET or the delay detection signal dDET.

The second internal voltage generation block 220 includes an internal initialization signal generator 221 and a plurality of second internal voltage generators 222-1 through 222-n. The internal initialization signal generator 221 may generate an internal initialization signal INPUR in response to at least one internal voltage (for example, VINTn) from among the first internal voltages VINT1 through VINTn.

The internal initialization signal INPUR may determine point in times when the second internal voltages VINTY1 through VINTYm are respectively generated. In an embodiment, the second internal voltages VINTY1 through VINTYm may be generated in response to at least one selected of the first internal voltages VINT1 through VINTn output from the first internal voltage generation block 210.

In another embodiment, the second internal voltages VINTY1 through VINTYm may be generated in response to at least one of the first internal voltages VINT1 through VINTn output from the first internal voltage generation block 210 and one of the detection signal DET and the delay detection signal dDET. In still another embodiment, the second internal voltages VINTY1 through VINTYm may be generated in response to the detection signal DET or the delay detection signal dDET. In still another embodiment, the second internal voltage generators 222-1 through 222-n may generate the second internal voltages VINTY1 through VINTYm in response to the internal initialization signal INPUR output from the internal initialization signal generator 221 and at least one of the first internal voltages VINT1 through VINTn.

Although the internal initialization signal INPUR is supplied to the second internal voltage generators 222-1 through 222-n in FIG. 3, initialization signals that are enabled at different points in time may be supplied to the second internal voltage generators 222-1 through 222-n, respectively.

Figure 4:
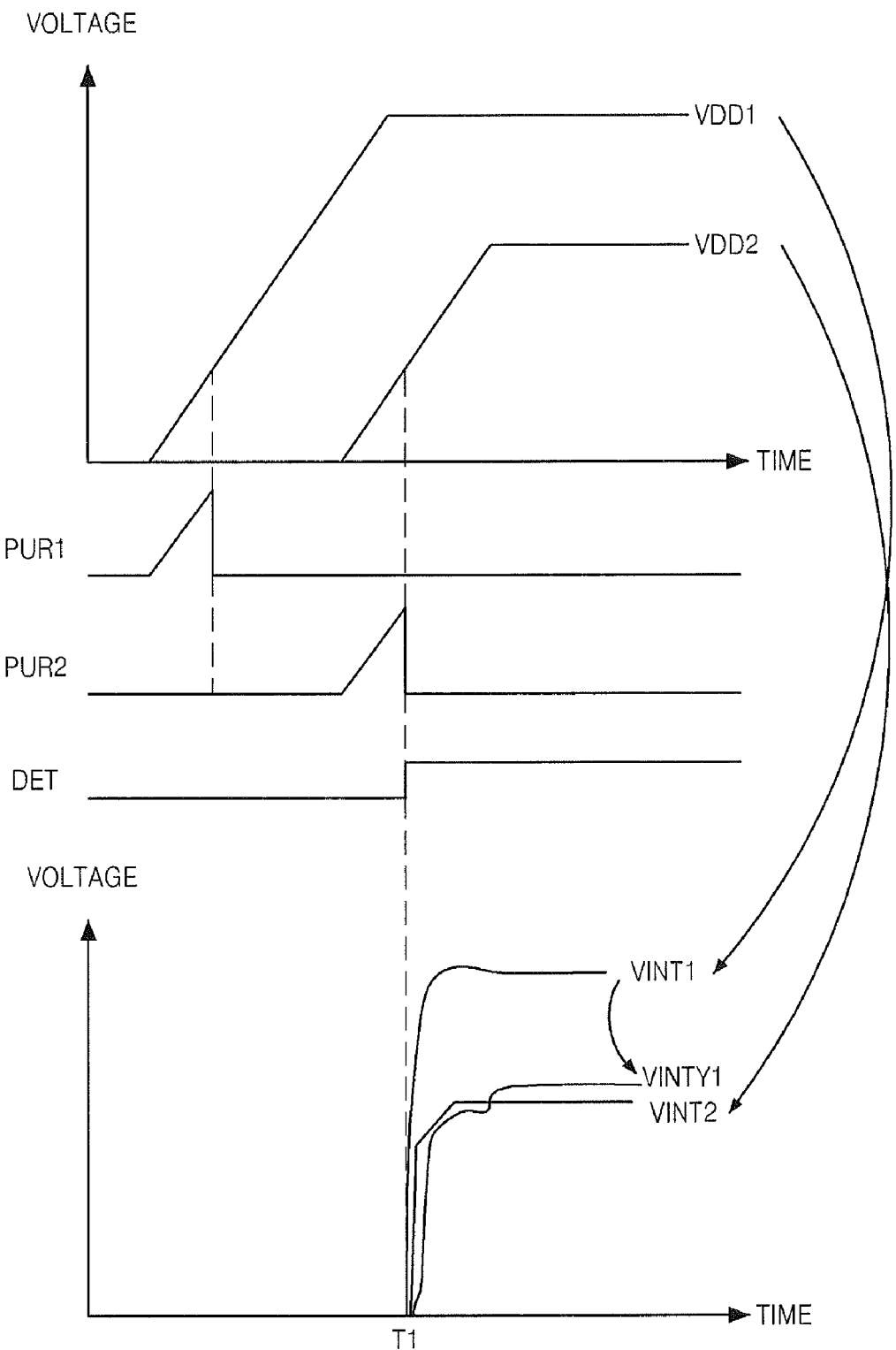
FIG. 4 is an exemplary timing diagram illustrating an operation of the internal voltage generation circuit illustrated in FIG. 1.

FIG. 4 is an exemplary timing diagram illustrating an operation of the internal voltage generation circuit illustrated in FIG. 1. For convenience of description, a case where n=2, namely, a timing diagram of two external power supply voltages VDD1 and VDD2 and three internal voltages VINT1, VINT2, and VINT1, is illustrated. Referring to FIGS. 1 and 4, the first external power supply voltage VDD1 that is greater than the second external power supply voltage VDD2 is supplied to the initialization signal generation block 100, prior to the second external power supply voltage VDD2.

The first initialization signal generator 110 detects the level of the first external power supply voltage VDD1 and generates a first initialization signal PUR1 according to a result of the detection. The second initialization signal generator 120 detects the level of the second external power supply voltage VDD2 and generates a second initialization signal PUR2 according to a result of the detection.

As illustrated in FIG. 4, the second initialization signal PUR2 is generated later than the first initialization signal PUR1.

The detector 130 detects a level transition of the second initialization signal PUR2 generated later than the first initialization signal PUR1, to output the detection signal DET. At a detection point of time T1 after both the two second external power supply voltages VDD1 and VDD2 are powered up, the detection signal DET transits from a first level (for example, a logic low level) to a second level (for example, a logic high level).

At the detection point of time T1, the internal voltage generator 210-1 of the first internal voltage generation block 210 may generate the internal voltage VINT1 by using the first external power supply voltage VDD1 in response to the detection signal DET. For example, the internal voltage generator 210-1 may be implemented into a switch or a level shifter for outputting the first external power supply voltage VDD1 as the internal voltage VINT1 in response to the detection signal DET. At the detection point of time T1, the internal voltage generator 210-2 of the first internal voltage generation block 210 may generate the internal voltage VINT2 by using the second external power supply voltage VDD2 in response to the detection signal DET. For example, the internal voltage generator 210-2 may be implemented into a switch or a level shifter for outputting the second external power supply voltage VDD2 as the internal voltage VINT2 in response to the detection signal DET.

The level shifter denotes a voltage generator capable of generating an output voltage that is higher or lower than an input voltage.

At the detection point of time T1, the internal voltage generator 222-1 of the second internal voltage generation block 220 may generate the internal voltage VINTY1 lower than the internal voltage VINT1 by using the internal voltage VINT1. In an embodiment, the internal initialization signal generator 221 may detect the level of the internal voltage VINT1 and generate an internal initialization signal INPUR according to a result of the detection. In this case, the internal voltage generator 222-1 may generate the internal voltage VINTY1 associated with the internal voltage VINT1 in response to the internal initialization signal INPUR.

Although all of the internal voltages VINT1, VINT2, and VINTY1 are generated at the detection point of time T1 in FIG. 4 for convenience of description, this is only an example.

In some embodiments, the internal voltages VINT1, VINT2, and VINTY1 may be generated at different points of time. Since the internal voltages VINT1, VINT2, and VINTY1 increase according to corresponding external power supply voltages VDD1 and VDD2 after the detection point of time T1, the internal voltage generation circuit 10 may reduce an overshoot phenomenon.

Figure 5:
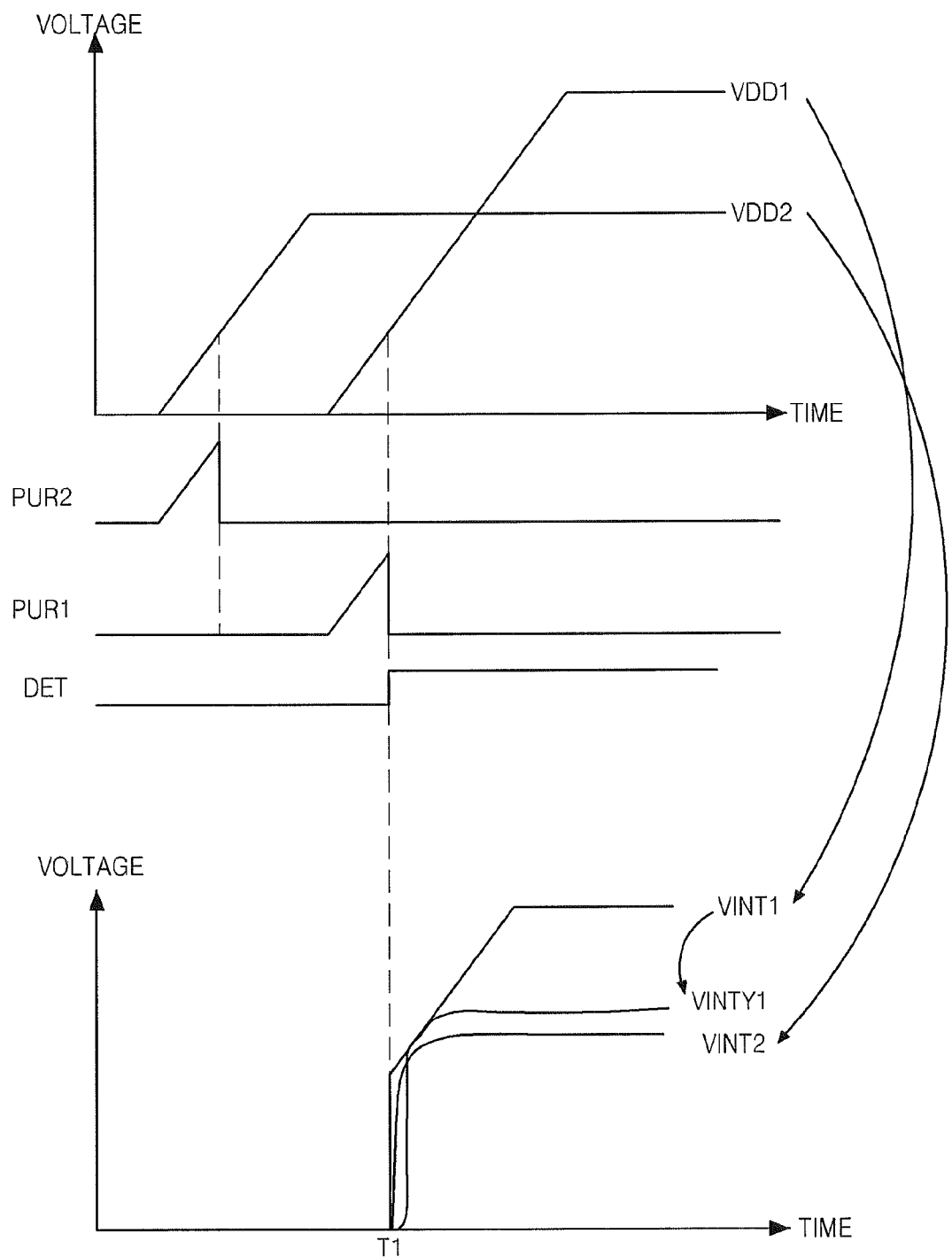
FIG. 5 is an another exemplary timing diagram illustrating an operation of the internal voltage generation circuit illustrated in FIG. 1.

FIG. 5 is an another exemplary timing diagram illustrating an operation of the internal voltage generation circuit illustrated in FIG. 1. For convenience of description, FIG. 5 illustrates a timing diagram of two external power supply voltages VDD1 and VDD2 and three internal voltages VINT1, VINT2, and VINTY1. Referring to FIGS. 1-3 and 5, the second external power supply voltage VDD2 that is lower than the first external power supply voltage VDD1 is supplied to the initialization signal generation block 100, prior to the first external power supply voltage VDD1.

Accordingly, the second initialization signal generator 120 detects the level of the second external power supply voltage VDD2 and generates the second initialization signal PUR2 according to a result of the detection. The first initialization signal generator 110 detects the level of the first external power supply voltage VDD1 and generates the first initialization signal PUR1 according to a result of the detection. That is, as illustrated in FIG. 5, the first initialization signal PUR1 is generated later than the second initialization signal PUR2.

The detector 130 detects a level transition of the first initialization signal PUR1 generated later than the second initialization signal PUR2, to output the detection signal DET. At a detection point of time T1 after the first and second external power supply voltages VDD1 and VDD2 are powered up, the detection signal DET transits from a logic low level to a logic high level.

At the detection point of time T1, the internal voltage generator 210-1 of the first internal voltage generation block 210 may generate the internal voltage VINT1 by using the first external power supply voltage VDD1 in response to the detection signal DET. For example, the internal voltage generator 210-1 may be implemented into a switch or a level shifter for outputting the first external power supply voltage VDD1 as the internal voltage VINT1 in response to the detection signal DET.

At the detection point of time T1, the internal voltage generator 210-2 of the first internal voltage generation block 210 may generate the internal voltage VINT2 by using the second external power supply voltage VDD2 in response to the detection signal DET. For example, the internal voltage generator 210-2 may be implemented into a switch or a level shifter for outputting the second external power supply voltage VDD2 as the internal voltage VINT2 in response to the detection signal DET. At the detection point of time T1, the internal voltage generator 222-1 of the second internal voltage generation block 220 may generate an internal voltage VINTY1 by using the internal voltage VINT1.

In an embodiment, the internal initialization signal generator 221 may generate an internal initialization signal INPUR in response to the internal voltage VINT1. In this case, the internal voltage generator 222-1 may generate the internal voltage VINTY1 lower than the internal voltage VINT1 by using the internal voltage VINT1, in response to the internal initialization signal INPUR.

Although all of the internal voltages VINT1, VINT2, and VINTY1 are generated at the detection point of time T1 in FIG. 5 for convenience of description, this is only an example. In some embodiments, the internal voltages VINT1, VINT2, and VINTY1 may be generated at different points of time. Since the internal voltages VINT1, VINT2, and VINTY1 increase according to corresponding external power supply voltages VDD1 and VDD2 after the detection point of time T1, the internal voltage generation circuit 10 may prevent overshooting of an internal voltage.

As illustrated in FIGS. 1, 4, and 5, after all of the external power supply voltages VDD1 through VDDn supplied to the internal voltage generation circuit 10 are powered up, the internal voltage VINT1 is powered up, and the internal voltage VINT2 is powered up. The internal voltage VINTY1 is powered up using the internal voltage VINT1.

Figure 6:
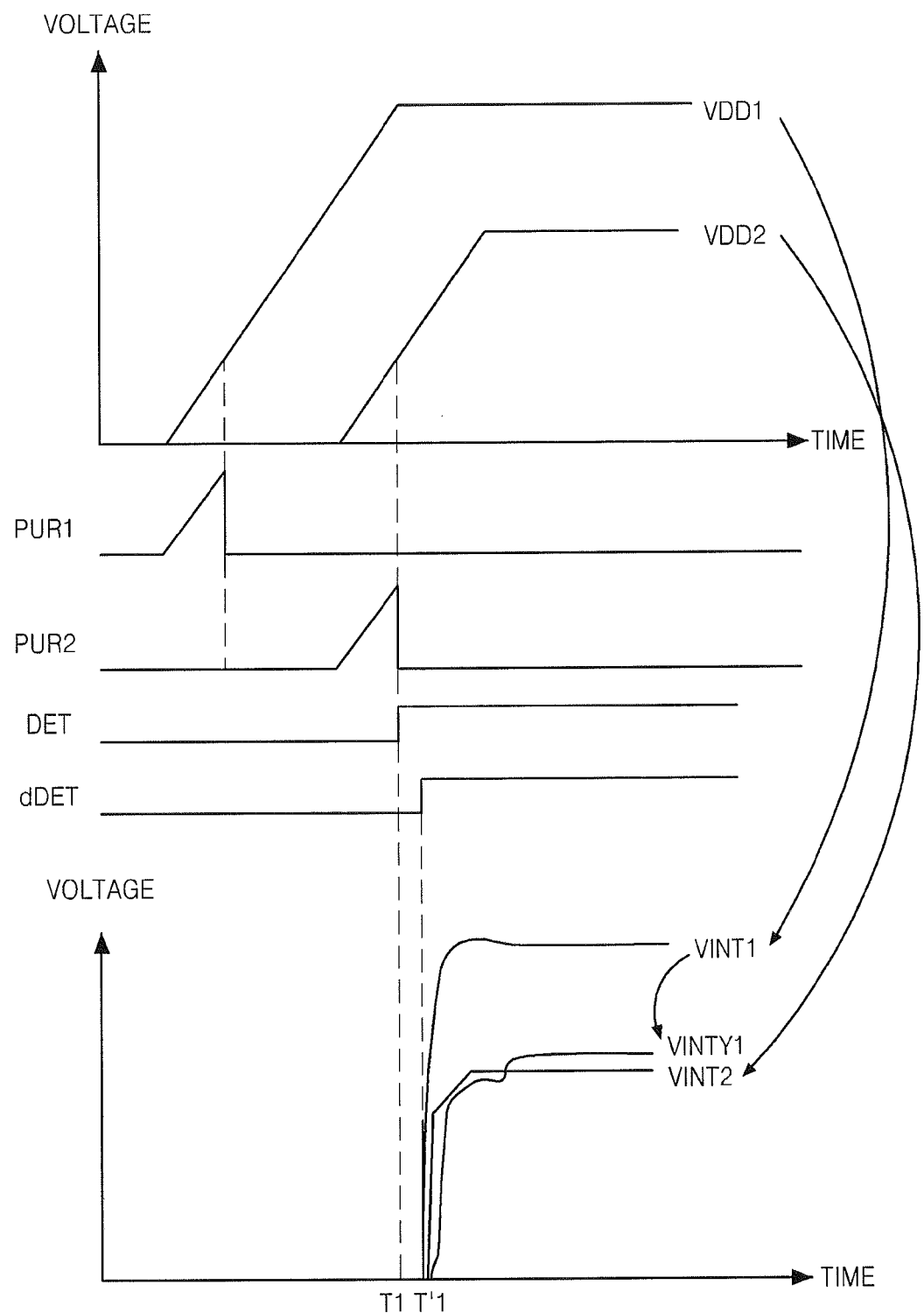
FIG. 6 is a still another exemplary timing diagram illustrating an operation of the internal voltage generation circuit illustrated in FIG. 1.
Figure 7:
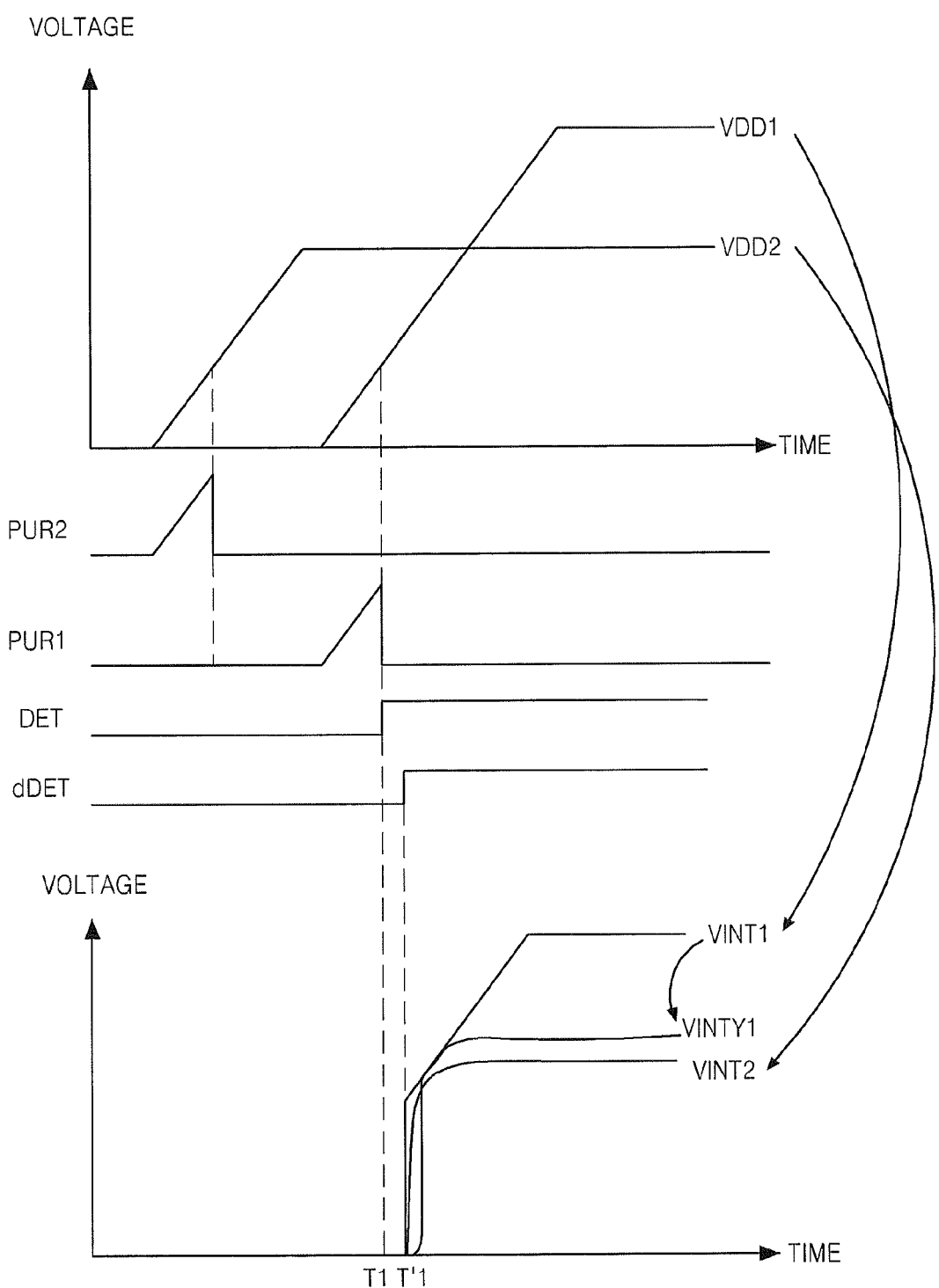
FIG. 7 is a still another exemplary timing diagram illustrating an operation of the internal voltage generation circuit illustrated in FIG. 1.

FIG. 6 is a still another exemplary timing diagram illustrating an operation of the internal voltage generation circuit illustrated in FIG. 1. FIG. 7 is a still another exemplary timing diagram illustrating an operation of the internal voltage generation circuit illustrated in FIG. 1. As illustrated in FIGS. 2, 3, 6, and 7, the internal voltage generation block 200 generates internal voltages (for example, the internal voltages VINT1, VINT2, and VINTY1) at a delay detection point in time T1' in response to the delay detection signal dDET output from the delay circuit 131, and thus reduce a surge current that is generated as the internal voltages (for example, the internal voltages VINT1, VINT2, and VINTY1) of the internal voltage generation block 200 are generated.

Although all of the internal voltages VINT1, VINT2, and VINTY1 are generated at the delay detection point in time T1' in FIGS. 6 and 7 for convenience of description, this is only an example. In some embodiments, the internal voltages VINT1, VINT2, and VINTY1 may be generated at different points of time.

Figure 8:
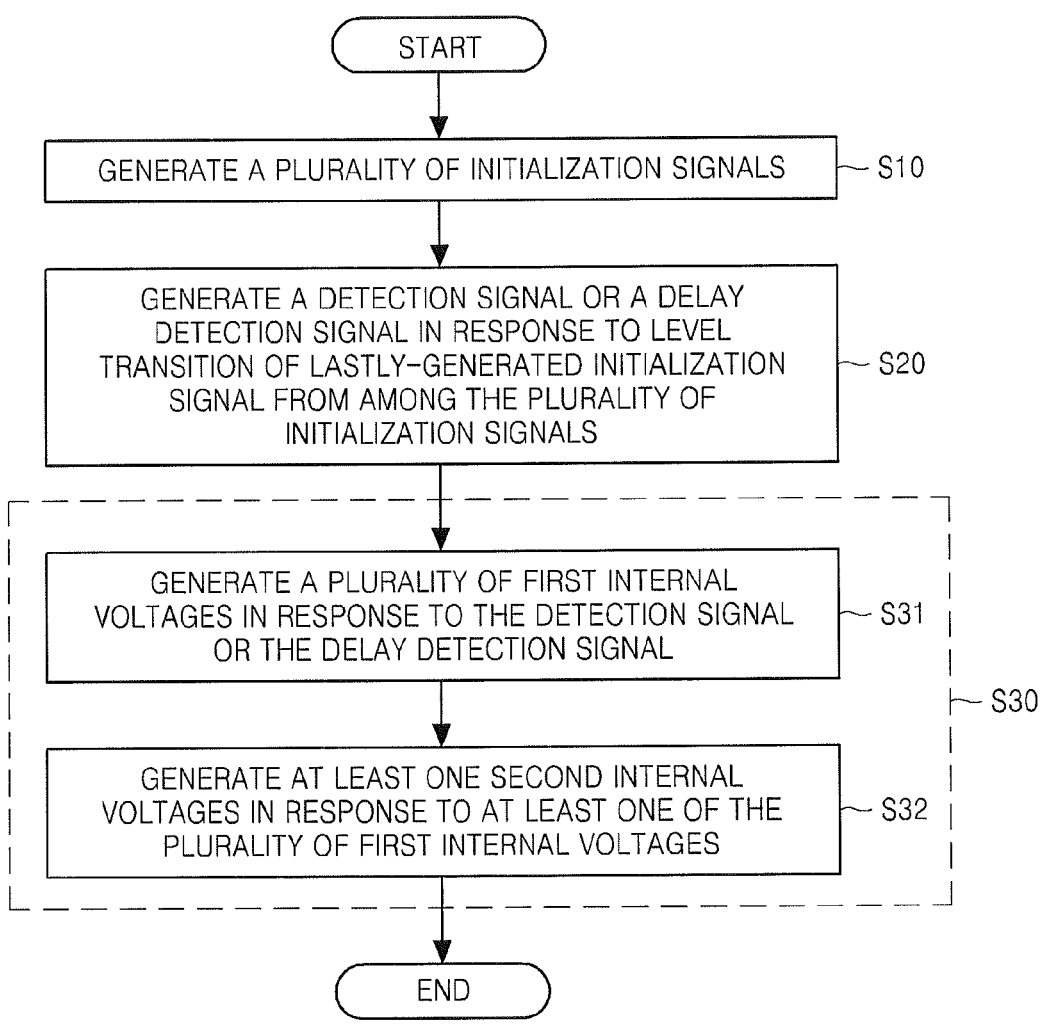
FIG. 8 is a flowchart of an operation of the internal voltage generation circuit illustrated in FIG. 1.

FIG. 8 is a flowchart of an operation of the internal voltage generation circuit illustrated in FIG. 1. Referring to FIGS. 1 through 8, in operation S10, the internal voltage generation circuit 10 of FIG. 1 generates the initialization signals PUR1 through PURn at different points in time on the basis of the external power supply voltages VDD1 through VDDn received at different points in time.

In operation S20, the internal voltage generation circuit 10 detects a level transition of the lastly generated initialization signal (that is, the initialization signal PUR2 in the cases of FIGS. 4 and 6 or the initialization signal PUR1 in the cases of FIGS. 5 and 7) from among the initialization signals PUR1 through PURn and generates the detection signal DET or the delay detection signal dDET according to a result of the detection. In operation S30, the internal voltage generation circuit 10 may generate a plurality of internal voltages VINT1 through VINTn and VINTY1 through VINTYm by using a plurality of external power supply voltages VDD1 through VDDn, respectively, in response to the detection signal DET or the delay detection signal dDET.

The operation S30 of generating the first and second internal voltages VINT1 through VINTn and VINTY1 through VINTYm will now be described in greater detail.

In operation S31, the internal voltage generation circuit 10 receives the external power supply voltages VDD1 through VDDn and generates the first internal voltages VINT1 through VINTn in response to the detection signal DET or the delay detection signal dDET. In operation S32, the internal voltage generation circuit 10 generates at least one of the second internal voltages VINTY1 through VINTYm by using at least one of the first internal voltages VINT1 through VINTn in response to at least one selected from the first internal voltages VINT1 through VINTn or either the detection signal DET or the delay detection signal dDET.

According to the present embodiment, the internal voltage generation circuit 10 may generate at least one stable internal voltage by using at least one of the external power supply voltages after all of the external power supply voltages are powered up. Since the internal voltage generation circuit 10 may generate each of the internal voltages by using the delay detection signal dDET, the internal voltage generation circuit 10 may reduce a surge current that may be generated at the detection point in time T1.

Figure 9:
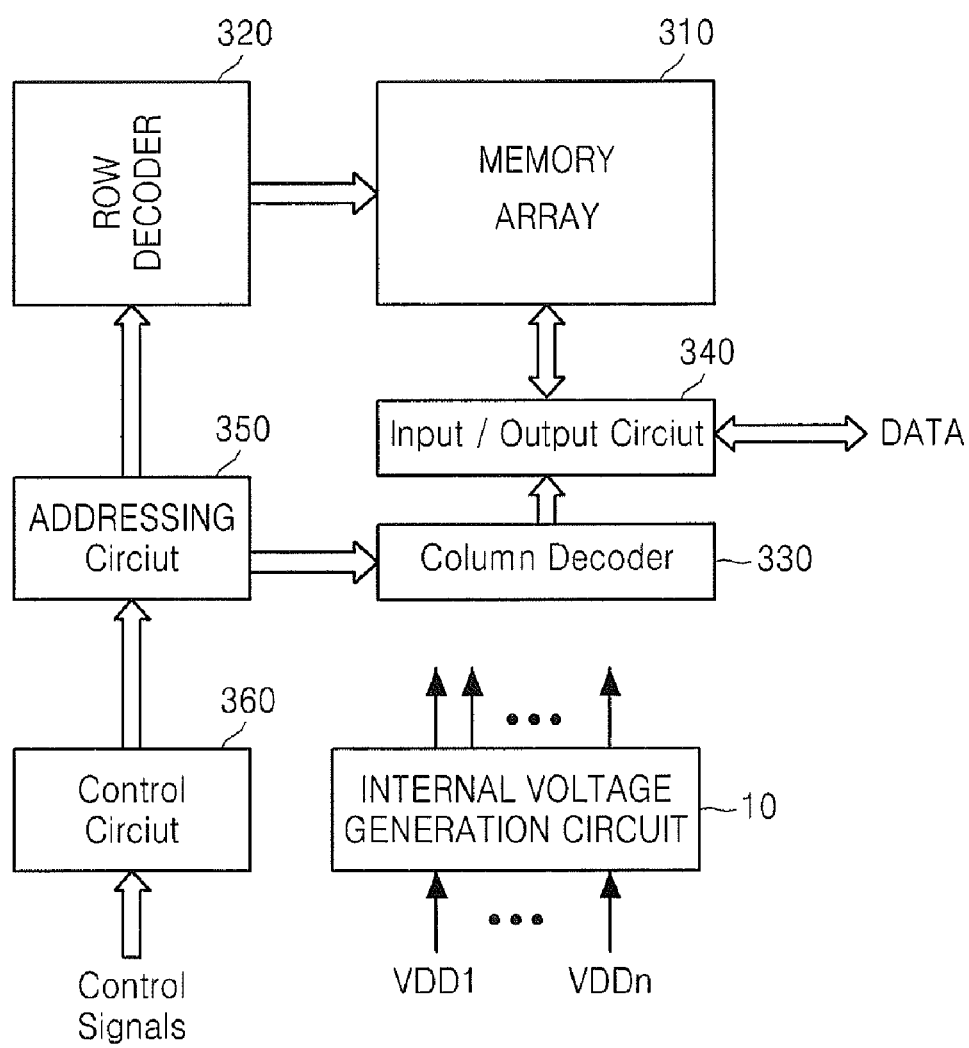
FIG. 9 is a block diagram of a semiconductor device including the internal voltage generation circuit illustrated in FIG. 1, according to an embodiment of the present invention.

FIG. 9 is a block diagram of a semiconductor device including the internal voltage generation circuit illustrated in FIG. 1, according to an embodiment of the present invention. Referring to FIG. 9, the semiconductor device 300 includes the internal voltage generation circuit 10, a memory array 310, a row decoder 320, a column decoder 330, an input/output circuit 340, an addressing circuit 350, and a control circuit 360.

The memory array 310 includes a plurality of word lines, a plurality of bit lines, and a plurality of memory cells connected between the word lines and the bit lines. Each of the memory cells may be implemented into a volatile memory cell such as a DRAM or an SDRAM.

Alternatively, each of the memory cells may be implemented into a non-volatile memory cell. Each of the non-volatile memory cells may be implemented into Electrically Erasable Programmable Read-Only Memory (EEPROM), flash memory, magnetic RAM (MRAM), Spin-Transfer Torque MRAM, conductive bridging RAM (CBRAM), Ferroelectric RAM (FeRAM), Phase change RAM (PRAM), Resistive RAM (RRAM or ReRAM), nanotube RRAM, polymer RAM (PoRAM), nano floating gate memory (NFGM), holographic memory, Molecular Electronics Memory Device, or Insulator Resistance Change Memory. Each of the non-volatile memory cells may store one bit or a plurality of bits.

The row decoder 320 receives row addresses from the addressing circuit 350 and decodes the row addresses so as to select one word line from the word lines. The column decoder 330 receives column addresses from the addressing circuit 350 and decodes the column addresses so as to selects one bit line from the bit lines.

The input/output circuit 340 may write data to at least one memory cell selected by the row decoder 320 and the column decoder 330. The input/output circuit 340 may read data from at least one memory cell selected by the row decoder 320 and the column decoder 330. The input/output circuit 340 may include a plurality of sense amplifiers for sensing and amplifying data DATA to be read during a read operation, and a plurality of drivers for driving data DATA to be written during a write operation.

The addressing circuit 350 may generate row addresses and column addresses under the control of the control circuit 360. The control circuit 360 generates a plurality of operation control signals for controlling an operation of the addressing circuit 350, in response to a plurality of control signals required to perform a read operation or a write operation.

As described above with reference to FIGS. 1 through 9, the internal voltage generation circuit 10 generates a plurality of internal voltages in response to the external power supply voltages VDD1 through VDDn. Each of the internal voltages may be supplied to the memory array 310, the row decoder 320, the column decoder 330, the input/output circuit 340, the addressing circuit 350, and the control circuit 360.

Figure 10:
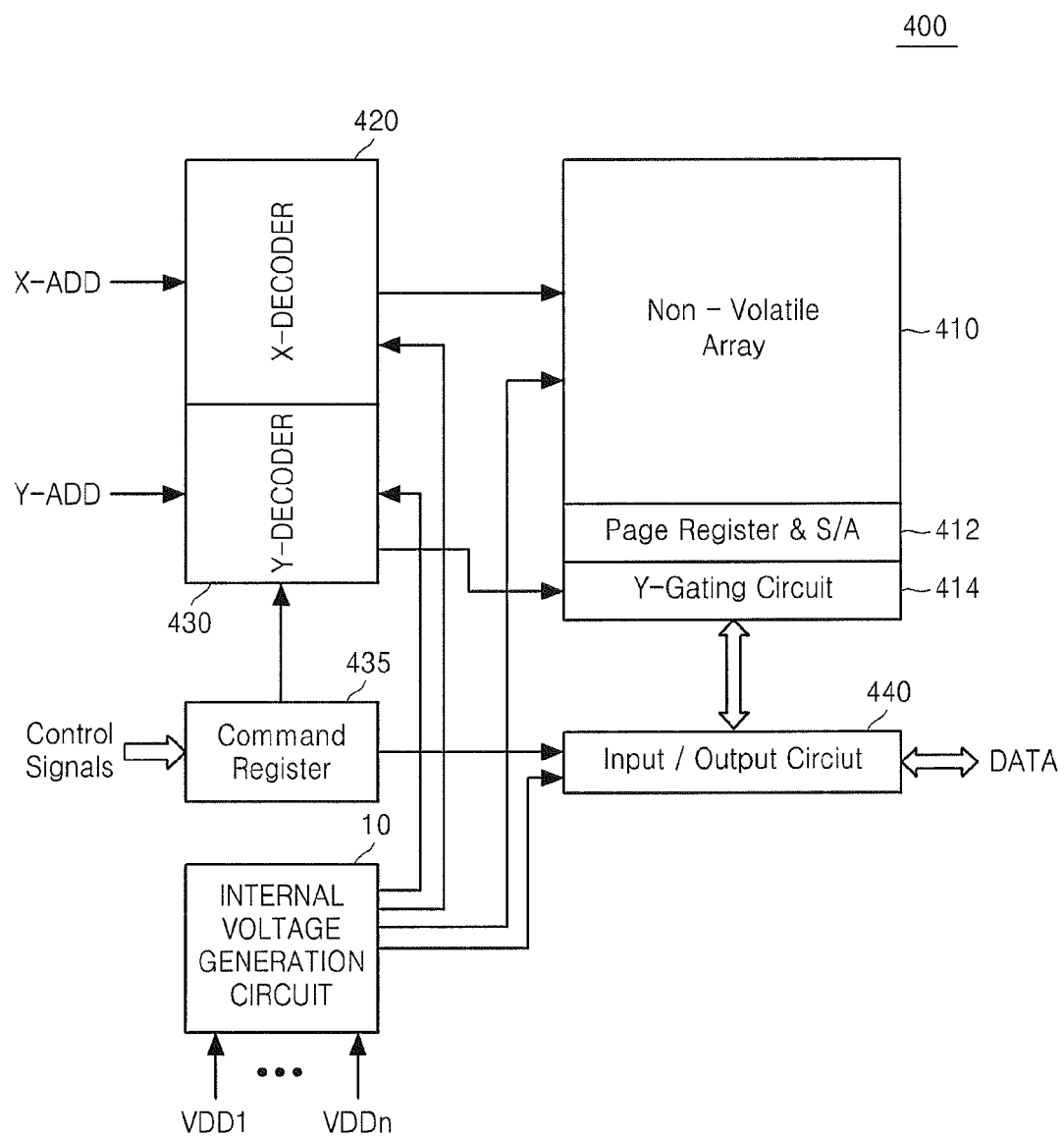
FIG. 10 is a block diagram of a semiconductor device including the internal voltage generation circuit illustrated in FIG. 1, according to another embodiment of the present invention.

FIG. 10 is a block diagram of a semiconductor device 400 including the internal voltage generation circuit 10 illustrated in FIG. 1, according to another embodiment of the present invention. Referring to FIG. 10, the semiconductor device 400 includes the internal voltage generation circuit 10, a memory array 410, a page register & sense amplifying (S/A) block 412, a Y-gating circuit 414, an X-decoder 420, a Y-decoder 430, a command register 435, and an input/output circuit 440.

The memory array 410 includes a plurality of non-volatile memory cells formed in a 2-dimensional matrix or 3-dimensional matrix. Each of the non-volatile memory cells may be implemented into the volatile memory cell described above with reference to FIG. 9. The page register & S/A block 412 may store data to be written to the memory array 410 or sense and amplify data read out of the memory array 410.

The Y-gating (or selection) circuit 414 may connect the page register & S/A block 412 to the input/output circuit 440 in response to a selection signal output from the Y-decoder 430 in order to perform a memory access operation, for example, a read operation, a write operation, a program operation, an erase operation, or a read verify operation.

The X-decoder (or row decoder) 420 capable of functioning as a buffer and a latch may select one word line from a plurality of word lines formed in the memory array 410, in response to a row address X-ADD. The Y-decoder (or column decoder) 430 capable of functioning as a buffer and a latch may select one bit line from a plurality of bit lines formed in the memory array 410, in response to a column address Y-ADD.

The command register 435 may generate a plurality of control signals capable of controlling operations of the X-decoder 420, the Y-decoder 430, and the input/output circuit 440, in response to a plurality of control signals received from an external source. The input/output circuit 440 may transmit externally-input data to the Y-gating circuit 414 during a write operation and transmit data output from the Y-gating circuit 414 to an external source during a read operation.

As described above with reference to FIGS. 1 through 8, the internal voltage generation circuit 10 generates a plurality of internal voltages in response to the external power supply voltages VDD1 through VDDn. Each of the internal voltages may be supplied to the memory array 410, the X-decoder 420, the Y-decoder 430, and the input/output circuit 440.

Figure 11:
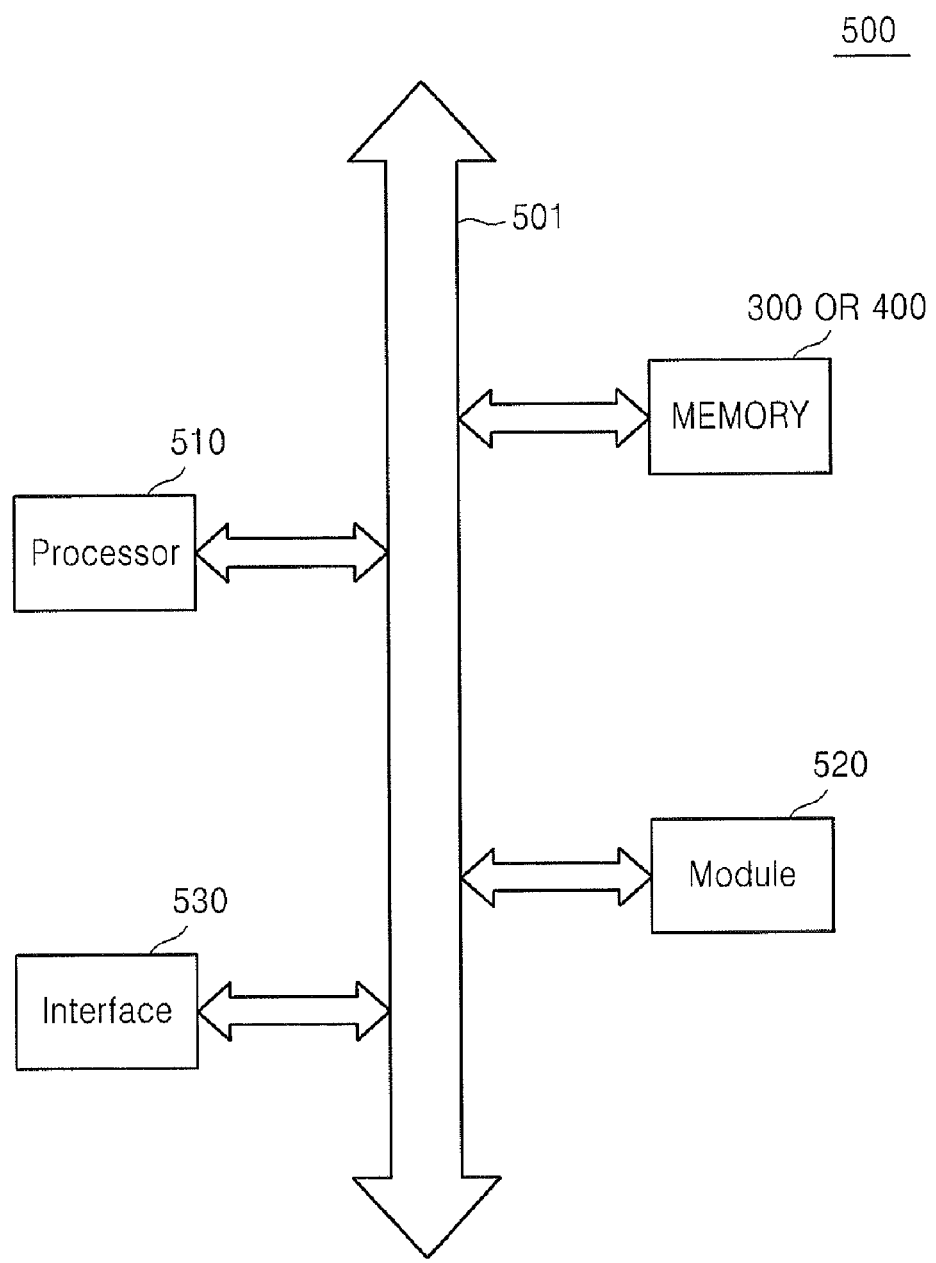
FIG. 11 is a block diagram of a semiconductor system including the semiconductor device illustrated in FIG. 9 or 10.

FIG. 11 is a block diagram of a semiconductor system 500 including the semiconductor device 300 or 400 illustrated in FIG. 9 or 10. Referring to FIG. 11, the semiconductor system 500 may be used in personal computers (PCs), portable computers, portable mobile communications devices, or consumer equipment (CE).

The portable mobile telecommunications devices include mobile telephones, personal digital assistants (PDAs), smart phones, or portable multimedia players (PMPs). The semiconductor system 500 may be a memory card or an electronic book (e-book). The semiconductor system 500 may also be a game player, a game controller, a navigator, or an electronic instrument. The CE may be a digital TV, a home automation device, or a digital camera.

The semiconductor system 500 includes the semiconductor device 300 or 400 and a processor 510. Thus, the semiconductor device 300 or 400 and the processor 510 may transmit data to or receive data from each other via a bus 501. For example, the processor 510 may control the entire memory access operation of the semiconductor device 300 or 400. The semiconductor system 500 may further include a module 520. The module 520 may be a wireless communication module. Thus, the module 520 may transmit data stored in the semiconductor device 300 or 400 to the outside via wireless communications and store data received from an external source in the semiconductor device 300 or 400, under the control of the processor 510.

The module 520 may be an image sensor. Thus, the image sensor may store a digital signal generated from a picked-up (or captured) image in the semiconductor device 300 or 400 and transmit data stored in the semiconductor device 300 or 400 to the outside via an interface 530, under the control of the processor 510.

The semiconductor system 500 may further include the interface 530. The interface 530 may be a display. Alternatively, the interface 530 may be an input device such as a keyboard, a mouse, touch panel, or a scanner, or an output device such as a printer.

When using a plurality of external power supply voltages, an internal voltage generation circuit according to an embodiment of the present invention generates a plurality of internal voltages in a certain sequence regardless of a change in the order in which the external power supply voltages are generated, thereby preventing overshooting of the internal voltages from occurring according to the levels of the external power supply voltages. In addition, the internal voltage generation circuit according to an embodiment of the present invention may reduce a surge current that may be generated when all of the internal voltages are simultaneously powered-up.

While aspects of this invention have been particularly shown and described with reference to preferred embodiments in accordance therewith, it will be understood by those skilled in the art that various changes in form and details may be made therein without departing from the spirit and scope of the invention as defined by the appended claims. It is intended by the following claims to claim that which is literally described and all equivalents thereto, including all modifications and variations that fall within the scope of each claim.

What is claimed is:

1. An internal voltage generating method performed in a semiconductor device, the internal voltage generating method comprising:
    generating a plurality of initialization signals corresponding to a plurality of external power supply voltages, respectively;
    detecting a transition of a lastly-generated initialization signal from among the plurality of initialization signals and generating a detection signal according to a result of the detection; and
    generating a first internal voltage according to the detection signal;
    generating an internal initialization signal in response to the first internal voltage; and
    generating a second internal voltage in response to the internal initialization signal and one of the plurality of external power supply voltages.

2. The internal voltage generating method of claim 1, further comprising generating a delay detection signal by delaying the detection signal for a predetermined period of time, wherein the first internal voltage is generated in response to the delay detection signal.

3. The internal voltage generating method of claim 1, further comprising generating at least one second internal voltage in response to the detection signal and the first internal voltage.

4. The internal voltage generating method of claim 1, wherein the plurality of external power supply voltages are supplied at different points in time and with different levels.

5. The internal voltage generating method of claim 1, wherein the generating the first internal voltage comprises generating the first internal voltage by using one of the plurality of external power supply voltages in response to the detection signal.

6. An internal voltage generation circuit of a semiconductor device, the internal voltage generation circuit comprising:
    an initialization signal generation block for generating a plurality of initialization signals in response to a plurality of external power supply voltages, respectively, detecting a transition of a lastly-generated initialization signal from among the plurality of initialization signals, and generating a detection signal; and
    an internal voltage generation block for generating a first internal voltage in response to the detection signal, wherein the internal voltage generation block comprises:
    an internal initialization signal generator for generating an internal initialization signal in response to the first internal voltage; and
    an internal voltage generator for generating a second internal voltage in response to the internal initialization signal and at least one selected from the plurality of external power supply voltages.

7. The internal voltage generation circuit of claim 6, wherein:
    the initialization signal generation block comprises a delay circuit for delaying the detection signal for a predetermined period of time so as to generate a delay detection signal; and
    the internal voltage generation block generates the first internal voltage in response to the delay detection signal.

8. The internal voltage generation circuit of claim 6, wherein the initialization signal generation block comprises:
    a plurality of initialization signal generators for generating the plurality of initialization signals corresponding to the plurality of external power supply voltages, respectively; and
    a detector connected to the plurality of initialization signal generators, for detecting the transition of the lastly generated initialization signal to generate the detection signal.

9. A semiconductor device comprising:
    an internal circuit for using a first internal voltage as an operating voltage;
    an initialization signal generation block for generating a plurality of initialization signals in response to a plurality of external power supply voltages, respectively, detecting a transition of a lastly-generated initialization signal from among the plurality of initialization signals, and generating a detection signal; and
    an internal voltage generation block for generating the first internal voltage in response to the detection signal, wherein the internal voltage generation block comprises:
    an internal initialization signal generator for generating an internal initialization signal in response to the first internal voltage; and
    an internal voltage generator for generating a second internal voltage in response to the internal initialization signal and at least one of the plurality of external power supply voltages.

10. The semiconductor device of claim 9, wherein:
    the initialization signal generation block comprises a delay circuit for delaying the detection signal for a predetermined period of time so as to generate a delay detection signal; and the internal voltage generation block generates the first internal voltage in response to the delay detection signal.

11. The semiconductor device of claim 9, wherein the internal voltage generation block generates the first internal voltage on the basis of at least one of the plurality of external power supply voltages.

12. The semiconductor device of claim 9, wherein the plurality of external power supply voltages are supplied at different points in time and with different levels.

* * * * *